United States Patent [19]
Shea

[11] Patent Number: 5,420,590
[45] Date of Patent: * May 30, 1995

[54] FREQUENCY DOMAIN POLARIMETER
[75] Inventor: Donald F. Shea, Plano, Tex.
[73] Assignee: E-Systems, Inc., Dallas, Tex.
[*] Notice: The portion of the term of this patent subsequent to Aug. 10, 2010 has been disclaimed.
[21] Appl. No.: 63,607
[22] Filed: May 19, 1993

Related U.S. Application Data

[63] Continuation-in-part of Ser. No. 827,414, Jan. 29, 1992, Pat. No. 5,235,340.

[51] Int. Cl.⁶ ............................................. G01S 13/00
[52] U.S. Cl. ................................................. 342/188
[58] Field of Search ......................................... 342/188

[56] References Cited

U.S. PATENT DOCUMENTS 3,836,973 9/1974 Shnitkin et al. .
3,890,571 6/1975 Beyer .
4,313,205 1/1982 Rhodes .
4,556,888 12/1985 McNaul .
5,235,340 8/1993 Shea ..................................... 342/188

FOREIGN PATENT DOCUMENTS 0279080 8/1988 European Pat. Off. .
2478820 9/1981 France .

Primary Examiner—Mark Hellner
Attorney, Agent, or Firm—Harold E. Meier

[57] ABSTRACT

The total energy, wave type, orientation and rotation of an incident electromagnetic signal having an unknown polarization is identified through single channel frequency domain signal analysis of the incident electromagnetic wave power as measured by an orthogonally polarized electromagnetic sensor. A controlled switch samples between the power measurements at each orthogonal output of the sensor to generate a signal comprised of a carrier frequency component and two sideband frequency components in the frequency domain. The sampled radio frequency signal is down converted by a single channel receiver to an intermediate frequency where the carrier and one sideband frequency component are separated and coherently shifted to the same frequency. A phase detector and ratiometer measure the relative phase and amplitude differences between the separated carrier and sideband frequency components to identify the wave type, orientation and rotation of the incident electromagnetic signal. In addition to identifying the type, orientation and rotation of the incident electromagnetic wave, the total energy of the incident polarized electromagnetic wave is determined using a single channel polarization diversity system or a single channel polarization insensitive system.

35 Claims, 4 Drawing Sheets

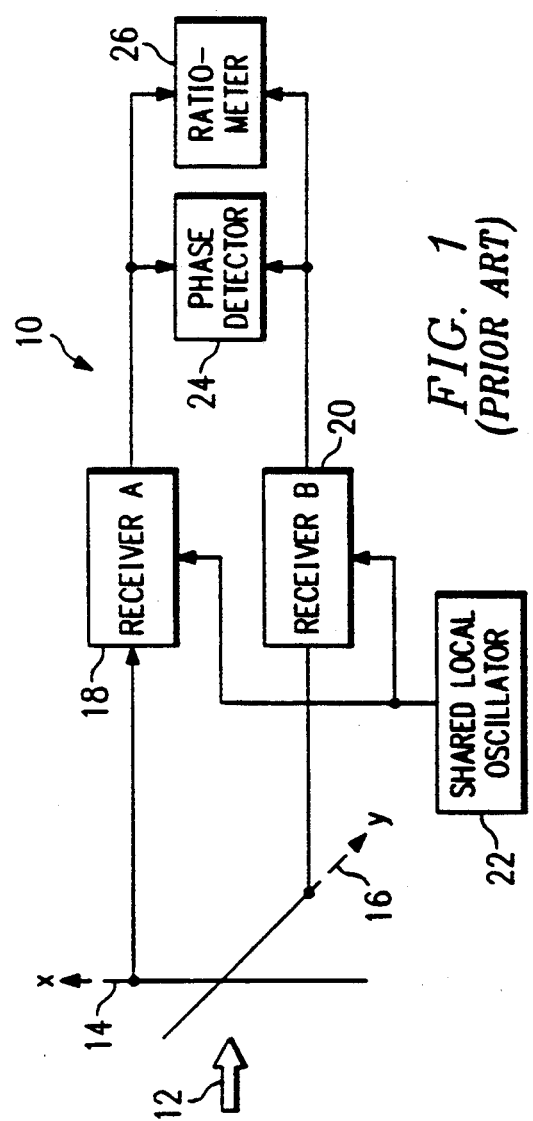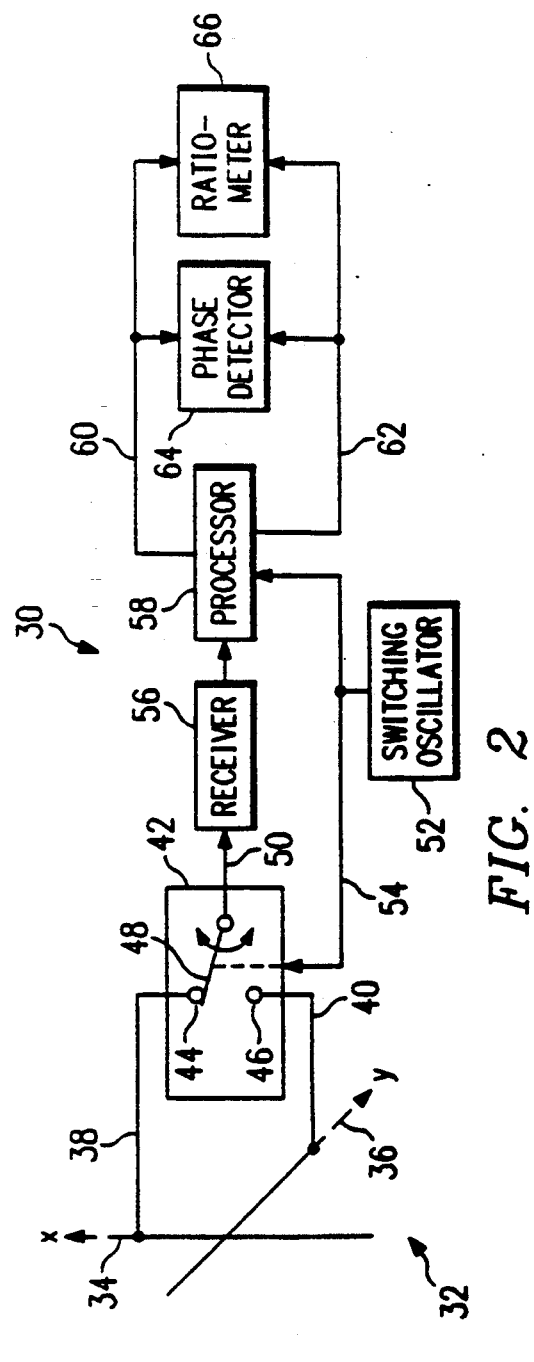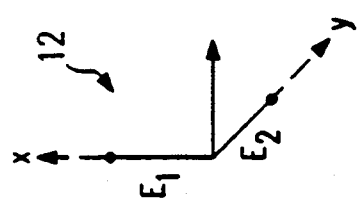

FREQUENCY DOMAIN POLARIMETER

RELATED APPLICATION

This application is a continuation-in-part of application Ser. No. 07/827,414, filed Jan. 29, 1992, now U.S. Pat. No. 5,235,340.

TECHNICAL FIELD

The present invention relates to measuring electromagnetic wave energy, and more particularly to an apparatus for measuring the polarization of an incident electromagnetic signal.

BACKGROUND OF THE INVENTION

It is well-known in the art that electromagnetic waves in the radio frequency spectrum may be linearly, elliptically or circularly polarized. Linearly polarized electromagnetic waves are confined to a single plane extending in the direction of wave propagation and may be oriented at any angle. Electromagnetic waves that are either circularly or elliptically polarized comprise a linear wave rotated about the axis of wave propagation in either a clockwise or counter-clockwise manner. The major axis of an elliptically polarized wave may be orientated at any angle in a manner similar to a linearly polarized wave.

In military applications, it is important that information on the incident electromagnetic wave type, that is, orientation and rotation, be determined as quickly as possible. This information provides an important parameter identifying the signature, or fingerprint, of the electromagnetic wave emitter. Once the wave information has been identified, the emitter that generated the incident electromagnetic wave can be recognized from its signature for purposes of intelligence gathering, homing, emitter sorting, interference reduction, or configuration of an active electromagnetic wave jammer.

Historically, polarimeters have been constructed of a dual channel receiver coupled to a dual orthogonally polarized antenna to measure the power of the polarization components of the incident electromagnetic wave. The measured power of these components identifies the polarization characteristics of the electromagnetic waves. A conventional polarimeter comprises an orthogonally polarized antenna coupled to a pair of phase and gain matched receivers. Identification of the type, orientation and rotation of the incident wave is accomplished by comparing the relative amplitude and phase of the output signals from the dual receivers.

In addition to identifying the type, orientation, and rotation of the incident electromagnetic wave, a polarimeter system must be capable of sensing the total energy in the incident polarized electromagnetic wave with as little energy loss as possible. In conventional dual channel receivers, a dual orthogonally polarized antenna receives from zero to one hundred percent of the energy in an incident polarized electromagnetic wave depending on the antenna's coupling coefficient to the electromagnetic wave's polarization. The pair of phase and gain matched receivers of the conventional dual channel receiver individually output two separate signals representing the energy in each of the two orthogonally polarized wave components. These two orthogonally polarized wave components always sum to one hundred percent of the incident polarized electromagnetic wave's energy if there is no energy loss in the system. The lower the energy loss in the system during the recovery of the energy of the incident polarized electromagnetic wave the greater will be the signal to noise ratio.

This conventional approach to polarimeter construction has proven to be unsatisfactory as it requires interconnecting two complex and costly phase and gain matched receivers. A further drawback of dual channel matched receiver polarimeters is that the second receiver adds weight to the apparatus and requires additional mounting space. In weight and space sensitive applications, for example, in military aircraft, the weight and space necessary to provide a second receiver for the polarimeter may not be available or, if available, is provided at the expense of other important system components.

Accordingly, there is a need for a signal processing technique for polarization detection that eliminates the need for complex and costly dual channel receivers. There is also a need for a signal processing technique for a polarization detection system that senses the total energy in the incident polarized electromagnetic wave without the need for complex and costly dual channel receivers.

SUMMARY OF THE INVENTION

The present invention overcomes the foregoing problems and other problems associated with conventional polarimeter construction by providing a signal processing technique utilizing a single channel receiver to detect wave characteristics and identify emitter signatures. In accordance with the broader aspects of the invention, the incident electromagnetic wave power is measured and output by an orthogonally polarized electromagnetic sensor. The output electromagnetic power from each sensor is processed by a single channel receiver for phase and amplitude comparison. The phase and amplitude comparison information is then further processed to identify the type (linear, circular or elliptical), orientation (polarization angle) and/or rotation (clockwise or counter-clockwise) of the incident electromagnetic wave. In addition to identifying the type, orientation, and rotation of the incident polarized electromagnetic wave, the signal processing technique of the present invention utilizes a single channel receiver to sense the total energy in the incident polarized electromagnetic wave. The total energy is the sum of the energy received simultaneously in the two orthogonally polarized components.

In particular, the orthogonally polarized sensor outputs are connected to a single-pole, double-throw radio frequency (RF) sampling switch driven by a stable squarewave oscillator operating at a sampling frequency equal to at least twice the bandwidth of the incoming signal. The RF output from the sampling switch consists of a carrier frequency component and two sideband components in the frequency domain produced by the interaction between the incident wave polarization and the modulating signal action of the sampling RF switch. The output of the RF switch is connected to a single channel receiver and down converted to an intermediate frequency (IF) output for further signal processing. The carrier and sideband frequency components are separated using bandpass filters and coherently shifted to the same frequency. Relative phase and amplitude between the shifted frequency components is then measured and compared to uniquely identify the polarization signature of the incident electromagnetic wave.

In the alternative, a polarization diversity system using the signal processing techniques of the present invention compares the relative amplitudes of the carrier and sideband frequency components and output the component which has the greatest amplitude. This polarization diversity system would result in a sensitivity which should not be degraded by more than 3 dB due to polarization. A conventional single polarized receiving system will sometimes fade more than 30 dB due to being cross polarized.

In another alternative, a polarization insensitive system using the signal processing techniques of the present invention compares the phase difference between the carrier and sideband frequency components. After the phase differential is determined, the carrier frequency component is phase shifted such that it is inphase with the sideband frequency component. It will be understood that either a separated sideband frequency component or the carrier frequency component may be shifted such that the two components are inphase. Once the carrier frequency component and the sideband frequency component are in-phase, the components are summed in a coupler to recover the total energy of the incident polarized electromagnetic wave, providing maximum sensitivity to the received signal with regard to polarization.

Possible applications for the apparatus of the present invention include electromagnetic intelligence gathering, multiple emitter sorting and recognition, calibration of homing systems, instrument sensitivity enhancement and interference reduction, and polarization configuration of active electromagnetic jammers. Other advantages in applications deriving from the use of the invention will readily suggest themselves to those skilled in the art from consideration of the following Detailed Description taken in conjunction with the accompanying Drawings.

BRIEF DESCRIPTION OF THE DRAWINGS

A more complete understanding of the invention may be had by reference to the following Detailed Description when taken in conjunction with the accompanying Drawings wherein:

FIG. 1 is a block diagram for a conventional dual channel matched receiver polarimeter;

FIG. 2 is a simplified block diagram for a single channel receiver frequency domain polarimeter;

DETAILED DESCRIPTION OF THE DRAWINGS

Figure 3:
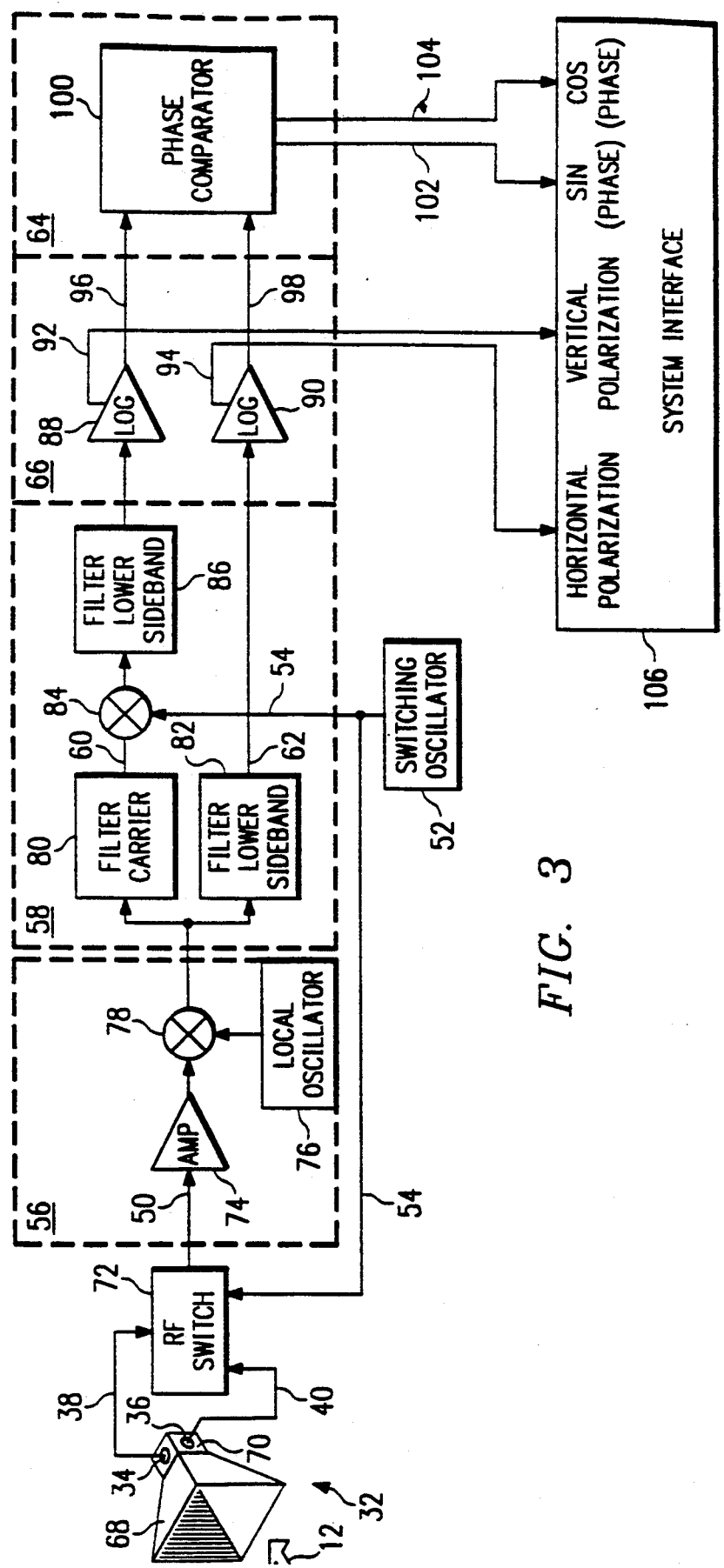
FIG. 3 is a block diagram showing the preferred embodiment for the single channel receiver frequency domain polarimeter.

Referring now to FIG. 1, there is shown a block diagram for a conventional dual channel phase and gain matched receiver polarimeter 10 for measuring wave type, orientation and/or rotation of an incident electromagnetic wave, generally indicated by an arrow 12. An orthogonally polarized antenna, schematically represented by two linear probes 14 and 16 measures the RF power of the incident wave 12. A pair of phase and gain matched receivers 18 and 20 are coupled to the orthogonal probes 14 and 16 respectively. A shared local oscillator 22 is connected to each matched receiver, 18 and 20, to down convert the RF signal measured by probes 14 and 16 to an IF signal. A phase detector 24 and ratiometer 26 compare the IF signals output from the matched receivers 18 and 20 to determine the polarization signature of the incident wave 12.

Referring now to FIG. 2, there is shown a block diagram for a single channel receiver frequency domain polarimeter 30 of the present invention for measuring the wave type, orientation and/or rotation of an incident polarized electromagnetic wave 12. An RF pickup 32 is utilized by the polarimeter 10 to measure the RF power of the incident wave 12. RF pickup 32 is comprised of a pair of orthogonal linear electromagnetic probes 34 and 36. It will be understood, of course, that any other suitable means may be provided for measuring orthogonally polarized RF power components of the incident wave 12.

A pair of RF conductors 38 and 40, for example, coaxial cables, couple the RF power measured by probes 34 and 36 to a single-pole, double-throw RF sampling switch 42. RF switch 42 is comprised of a pair of contact points 44 and 46 connected to the RF conductors 38 and 40 respectively. Switch 42 further comprises a controlled gate 48 that is switched between contacts 44 and 46 to sample the RF power from probes 34 and 36. The sampled RF power is coupled from gate 48 to an RF output conductor 50. Sampling movement of gate 48 is controlled by an input square wave generated by a fixed frequency square wave oscillator 52 and coupled to switch 42 through line 54. The fixed oscillation frequency of the square wave output by oscillator 52 is selectively chosen to cause switch 42 to sample the RF power at probes 34 and 36 at a frequency at least two times the bandwidth of the incoming signal.

Modulation of the incident wave 12 through the square wave sampling of switch 42 produces an output RF signal on conductor 50 comprised of a carrier frequency component and two sideband frequency components in the frequency domain. The frequency domain spectrum of the signal at the output of the switch 42 is a function of the polarization of incident electromagnetic signal and the switching frequency as shown below.

As is well known, the instantaneous electric field vector E of an incident plane wave 12 of unknown polarization may be written as:

$$E = E_1 e^{j\omega t} i + E_2 e^{j\omega t + \beta} k \qquad (1)$$

wherein:

$E_1$ = peak amplitude of the electric field in x-direction i;

$E_2$ = peak amplitude of the electric field in y-direction k; and $\beta$ = phase by which the y-component of the electric field leads the x-component.

The relationship between $E_1$, $E_2$ and $\beta$ defines the polarization type, orientation and rotation of the incident electromagnetic signal in a manner well known. Table 1 shows some selected examples of the manner in which $E_1$, $E_2$ and $\beta$ influence polarization signature (type, orientation and rotation).

TABLE 1

| $E_1$ | $E_2$ | $\beta$ | Polarization Signature |
|---|---|---|---|
| 1 | 0 | — | Horizontal |

TABLE 1-continued

| $E_1$ | $E_2$ | $\beta$ | Polarization Signature |
|---|---|---|---|
| 0 | 1 | — | Vertical |
| 1 | 1 | 0 | slant linear (45°) |
| 1 | 1 | 180° | slant linear (−45°) |
| 1 | 1 | +90° | clockwise circular |
| 1 | 1 | −90° | counter-clockwise circular |
| 1 | 0.5 | +90° | clockwise elliptical |
| 0.5 | 1 | −90° | counter-clockwise elliptical |

Using dual orthogonal linear probes and a single-pole, double throw switch, the power of the x- and y-components of the electric field is alternatively measured and sampled. The received electric field signal $E_r(t)$ output on conductor 50 from switch 42 may be written as:

$$E_r(t) = E_1 e^{jwt} S(t) + E_2 e^{jwt+\beta} S(t-T/2) \quad (2)$$

wherein:

$$S(t) = 1 \text{ for } 0 < t < T/2$$
$$= 0 \text{ for } T/2 < t < T, \text{ and}$$
$$S(t - T/2) = 0 \text{ for } 0 < t < T/2$$
$$= 1 \text{ for } T/2 < t < T,$$

represent the sampling action of switch 42.

In the frequency domain (G), $E_r(t)$ is comprised of a carrier frequency component and two sideband frequency components, and may be written after a $\beta/2$ phase shift as:

$$G_R(w) = F[E_1 e^{jwt-\beta/2}] * F[S(t)] + F[E_2 e^{jwt+\beta/2}] * F[S(t-T/2)] \quad (3)$$

wherein: F represents the Fourier Transform operation.

This frequency domain representation contains the polarization information ($E_1$, $E_2$ and $\beta$) to be manipulated by the frequency domain polarimeter 30 of the present invention to identify wave type, orientation and rotation in a manner to be described.

A single channel RF receiver 56 down converts the high frequency RF output signal on conductor 50 to an IF signal continuing to be comprised of a carrier and two sideband frequency components in the frequency domain. As is well known, down converting of a signal merely shifts the signal in the frequency domain without altering its frequency domain characteristics. The IF signal output by receiver 56 is connected to a processing unit 58 where the carrier and one sideband frequency component are separated and coupled to two processing conductors, 60 and 62, respectively.

The polarization signature (wave type, orientation and rotation) is then identified from the frequency domain characteristics by a phase detector 64 and a ratiometer 66 by measuring $E_1$, $E_2$ and $\beta$. Phase detector 64 coherently shifts the separated carrier and sideband frequency components to the same frequency and measures the phase difference ($\beta$) between the components. Detection of the phase difference ($\beta$) identifies the rotational characteristics of the incident wave 12 in a manner well known in the art. Ratiometer 66 measures the relative amplitude between the separated carrier ($E_1$) and sideband ($E_2$) frequency component. Detection of the relative amplitude ($E_1/E_2$) identifies the wave type and orientation of the incident wave 12 in a manner well known in the art. Thus, the frequency domain polarimeter 30 uniquely identifies and defines the polarization signature of the incoming signal utilizing a single channel receiver and frequency domain signal processor.

Referring now to FIG. 3, wherein like reference numerals refer to like or similar parts, there is shown the preferred embodiment for the frequency domain polarimeter 30. The RF pickup 32 comprises a horn antenna 68 and rectangular wave guide 70 terminated by a pair of orthogonal linear electromagnetic probes 34 and 36. It will be understood, however, that any other suitable antenna and/or wave guide structure may be substituted for the horn 68 and rectangular wave guide 70 to enable measurement of RF power provided that the sensor includes orthogonally polarized outputs.

A pair of RF conductors 38 and 40 couple the RF power measured by probes 34 and 38 respectively to an RF switch 72 that may comprise a PIN diode switch and driver. RF switch 72 alternately samples the RF power on conductors 38 and 40 and couples the sampled power measurements to an RF output conductor 50. A driver signal generated by a switching oscillator 52 on line 54 controls the sampling function of the RF switch 72. The switching signal output by oscillator 52 preferably comprises a square wave with a frequency at least two times the bandwidth of the incident signal.

Modulation of the incident wave 12 with the square wave sampling of switch 72 produces an RF output signal on conductor 50 comprised of a carrier and two sideband frequency components in the frequency domain. The characteristics of the frequency domain representation of the RF signal output from switch 72 are determined by the unknown polarization of the incident wave 12 and the switch modulation. Polarization information, including wave type, orientation and rotation, is extracted from the frequency domain representation of the sampled incident wave by comparing the relative amplitude and phase of the generated carrier and sideband frequency components.

A single channel receiver 56, comprised of an RF amplifier 74, an adjustable frequency local oscillator 76 and a mixer 78, is used to down convert the RF signal to an IF signal for further frequency domain processing. The IF signal output from mixer 78 is still comprised of a carrier and two sideband frequency components as mixing of the RF output signal on conductor 50 with the local oscillator merely shifts the RF frequency spectrum to the IF spectrum to enable further frequency processing and identification of the polarization signature of the incident wave.

The IF signal is then processed by a pair of tuned bandpass filters 80 and 82 to separate the carrier and one sideband frequency component onto two conductors 60 and 62 respectively. Although filter 82 is shown tuned to separate out the lower sideband frequency component, it will be understood that equivalent polarization signature information may be extracted through separation of either the upper or lower sideband frequency component. The separated carrier frequency component on line 60 is coherently shifted to the same frequency as the sideband frequency component by mixing the separated carrier with the square wave signal generated by the switching oscillator 52. Although mixer 84 is shown mixing the carrier frequency component with the switching oscillator frequency, it will be understood that either separated sideband or carrier frequency component may be mixed to coherently shift the components to the same frequency. A filter 86, tuned to the lower sideband frequency component, passes the shifted carrier frequency components out of the processing unit 58.

The amplitude of the separated and coherently shifted carrier and sideband frequency components output from the processing unit 58 is then measured by a pair of logarithmic amplifiers 88 and 90 respectively. Amplitude information on the separated carrier and sideband frequency components is output over lines 92 and 94 respectively for identification of wave type and orientation of the incident wave in a manner well known. A second set of output lines 96 and 98 pass the separated carrier and sideband frequency components to a phase detector section 64 of the polarimeter. Phase comparator 100 of the phase detector section 64 measures and compares the relative phase between the coherently shifted frequency components. This information is output over lines 102 and 104 and processed in a manner well known in the art to identify the rotation of the incident wave.

A system interface 106 receives the amplitude and phase information over lines 92, 94, 102 and 104 for processing to identify the polarization of the incident wave 12 in the manner shown in Table 1. Signals output over lines 88 and 90 relate to the vertical ($E_1$) and horizontal ($E_2$) electric field amplitudes. Signals output over lines 102 and 104 relate to the phase ($\beta$) between the field components.

Figure 4:
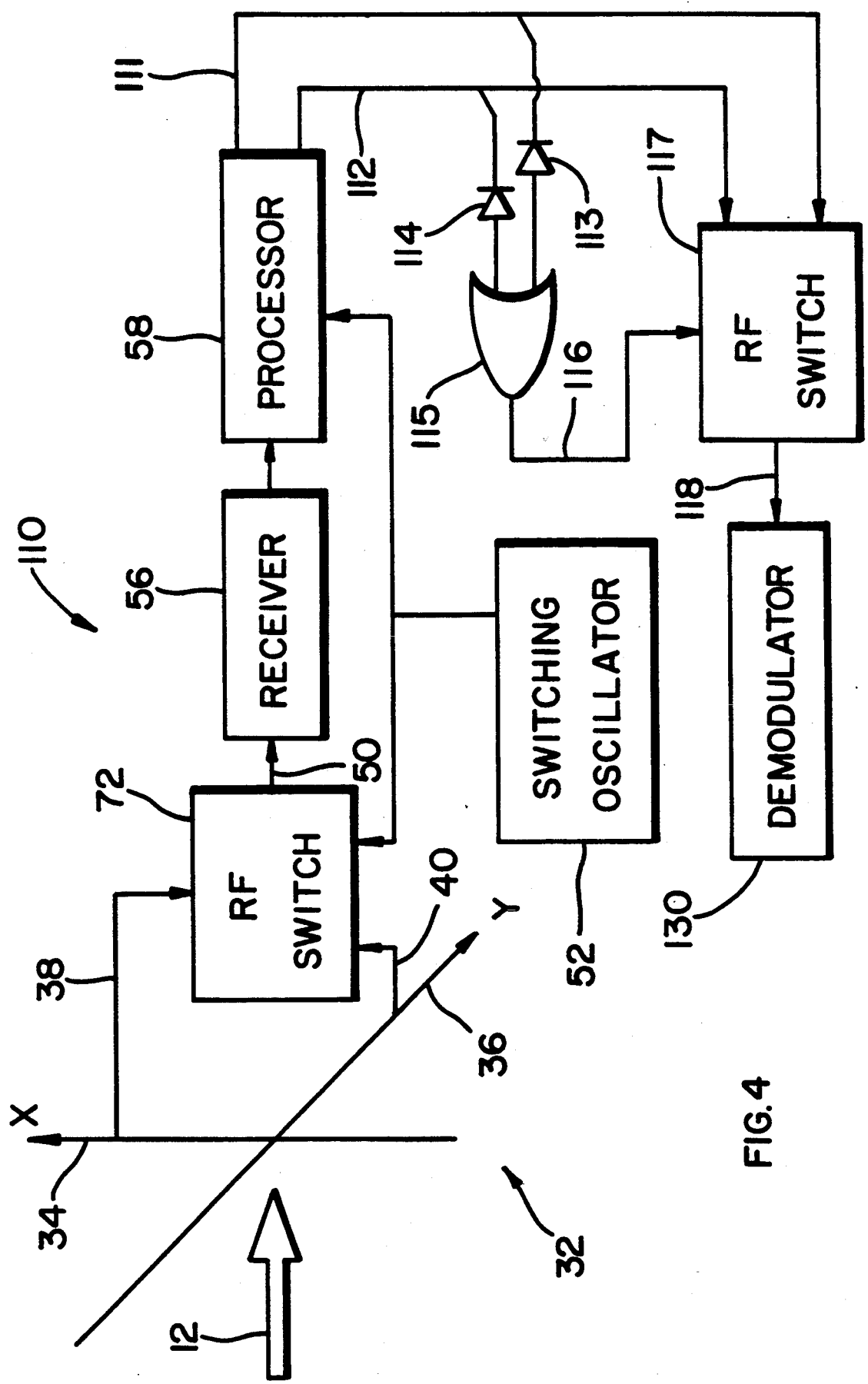
FIG. 4 is a block diagram for a single channel receiver polarization diversity system.

Referring now to FIG. 4, there is shown a block diagram for an alternative embodiment of the invention. The alternative embodiment is a single channel receiver polarization diversity system 110 for simultaneously sensing the energy in two orthogonally polarized components of the incident polarized electromagnetic wave 12 and outputting the component with the greater energy.

As in previously described embodiments, an RF pickup 32 is utilized by the polarization diversity system 110 to receive the incident polarized electromagnetic wave 12. The RF pickup 32 includes a pair of orthogonal linear electromagnetic probes 34 and 36. It will be understood, of course, that any other suitable means may be provided for measuring orthogonally polarized RF power components of the incident polarized electromagnetic wave 12.

A pair of RF conductors 38 and 40, for example, coaxial cables, couple the RF power measured by probes 34 and 36 to a single-pole, double-throw RF sampling switch 72. RF sampling switch 72 is coupled to a switching oscillator 52 which outputs a fixed frequency square wave selectively chosen to cause the RF sampling switch 72 to sample the RF power at a frequency at least two times the bandwidth of the incident polarized electromagnetic wave 12.

The modulation of the incident polarized electromagnetic wave 12 through the square wave sampling of RF sampling switch 72 produces an output RF signal on conductor 50 comprised of a carrier frequency component and two sideband frequency components in the frequency domain. The single channel RF receiver 56 down converts the high frequency RF output signal on conductor 50 to an IF signal continuing to be comprised of a carrier and two sideband frequency components in the frequency domain. The IF signal output is connected to a processor 58 where the carrier frequency component and a sideband frequency component are separated. In the processor 58, the carrier frequency component is coherently shifted to the same frequency as the sideband frequency component. It will be understood that either the carrier frequency component or the sideband frequency component may be coherently shifted to the same frequency. The coherently shifted carrier frequency component is output on line 111 and the sideband frequency component is output on line 112.

Lines 111 and 112 are coupled to a first detector 113 and second detector 114, respectively. The first detector 113 coupled to line 111 carrying the coherently shifted carrier frequency component outputs a voltage signal proportional to the energy level of the coherently shifted carrier frequency component. The second detector 114 coupled to line 112 carrying the sideband frequency component outputs a voltage signal proportional to the energy level of the sideband frequency component. The output of first detector 113 and the output of second detector 114 are coupled to an amplitude comparator 115. The amplitude comparator 115 compares the relative amplitude of the outputs by detector 113 and detector 114 and generates a signal on line 116 that drives a single-pole double-throw switch 117 to the larger amplitude component on line 111 and line 112. The largest received component is output from the single channel receiver polarization diversity system of the present invention on line 118 and may be coupled to a demodulator 130 or other device for purposes of additional signal processing. With this approach, the sensitivity of the single channel receiver polarization diversity system 110 will experience degraded performance by no more than 3 dB due to polarization.

Figure 5:
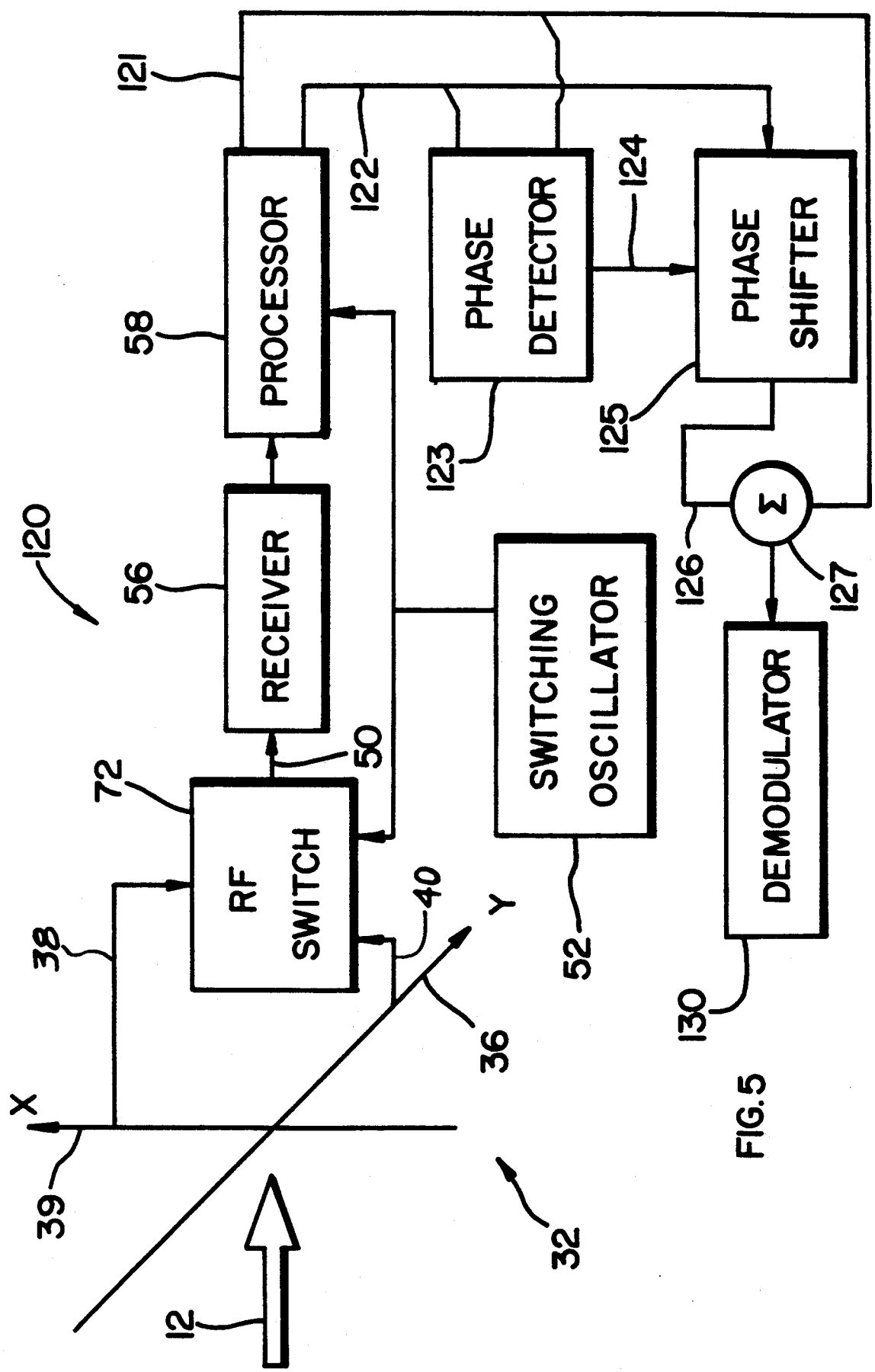
FIG. 5 is a block diagram for a single channel receiver polarization insensitive system.

Referring to FIG. 5, a still further embodiment of the present invention is a single channel receiver polarization insensitive system 120. The RF pickup 32, the single-pole double-throw RF sampling switch 72, the switching oscillator 52, the single channel receiver 56, and the polarimeter processor 58 are the same as in previously described embodiments of the present invention. Line 121 carrying the coherently shifted carrier frequency component and line 122 carrying the sideband frequency component are coupled to a phase detector 123. The phase detector 123 detects the phase differential between the carrier frequency component and the sideband frequency component. The phase detector 123 then outputs a signal on line 124 responsive to the phase differential between the carrier frequency component and the sideband frequency component. Line 124 is coupled to phase shifter 125 which, in response to the signal on line 124, shifts the phase of the sideband frequency component on line 122 such that the carrier frequency component and the sideband frequency component are in-phase. It will be understood that either the sideband frequency component on line 122 or the carrier frequency component on line 121 may be shifted by a phase shifter to get the two components in-phase. The phase shifter outputs the in-phase sideband frequency component on line 126 which is coupled to a summer 127 comprises a 3 dB coupler. Summer 127 adds the carrier frequency component on line 121 to the phase shifted sideband frequency component on line 126 to sense the total energy in the incident polarized electromagnetic wave 12. The output from the single channel receiver polarization insensitive system on line 128 may be coupled to a demodulator 130 or other device for purposes of additional signal processing. Such a system provides maximum sensitivity to the received polarized electromagnetic wave 12 with regard to polarization. With this approach, the sensitivity of the system will experience degraded performance by no more than the losses in the system and no degradation due to polarization.

Although a preferred embodiment of the invention has been illustrated in the accompanying Drawings and described in the foregoing Detailed Description, it will be understood that the invention is not limited to the embodiment disclosed but is capable of numerous rearrangements and modifications of parts and elements without departing from the scope of the invention.

I claim:

1. Apparatus for processing an incident electromagnetic signal, comprising:
   means for identifying the orthogonal components of electromagnetic power in an incident electromagnetic signal;
   means for sampling the orthogonal electromagnetic power components to output on a single channel a sampled signal comprising a carrier frequency component and two sideband frequency components in the frequency domain;
   means for separating the carrier frequency component from the sideband frequency components;
   means for comparing the relative amplitude of the carrier frequency component and one of the sideband frequency components; and
   means responsive to the comparison for outputting the component with the larger amplitude.

2. The apparatus of claim 1 wherein said means for identifying comprises a dual orthogonally polarized electromagnetic sensor.

3. The apparatus of claim 1 wherein said means for sampling comprises:
   a single-pole, double-throw switch coupled to receive the identified orthogonal electromagnetic power components and output the sampled signal; and
   a switching oscillator connected to said switch to cause the switch to sample between the identified orthogonal power components.

4. The apparatus of claim 1 wherein said means for separating comprises:
   a first filter for receiving the sampled signal, bandpass tuned to separate out the carrier frequency component; and
   a second filter for receiving the sampled signal, bandpass tuned to separate out one sideband frequency component.

5. The apparatus of claim 4 wherein said means for separating further comprises:
   means for mixing a switching oscillator signal with the separated carrier frequency component to coherently shift the carrier frequency component to the frequency of one of the separated sideband frequency components; and
   a filter tuned to the frequency of the selected separated sideband frequency component to filter the coherently shifted carrier frequency component.

6. The apparatus of claim 1 wherein said means for comparing comprises:
   a first detector for outputting a voltage signal related to the amplitude of the carrier frequency component;
   a second detector for outputting a voltage signal related to the amplitude of one of the sideband frequency components; and
   an amplitude comparator for determining the component with the larger relative amplitude.

7. The apparatus of claim 6 wherein said means for outputting comprises:
   a single-pole double-throw switch coupled to the amplitude comparator;
   said amplitude comparator generating a signal for toggling said switch to output the component with the larger relative amplitude.

8. Apparatus for processing an incident electromagnetic signal, comprising:
   means responsive to the incident electromagnetic signal for outputting on a single channel a sampled signal comprising a carrier frequency component and two sideband frequency components in the frequency domain;
   means for receiving the sampled signal on the single channel and for comparing the relative amplitude of the carrier frequency component and one selected sideband frequency component; and
   means coupled to the means for receiving and comparing for selecting for output the component with the larger relative amplitude.

9. The apparatus of claim 8 wherein said means for receiving and comparing comprises:
   means for mixing a switching oscillator signal with the carrier frequency component to coherently shift the carrier frequency component to the frequency of the one selected sideband frequency component;
   a filter tuned to the frequency of the one selected sideband frequency component to filter the coherently shifted carrier frequency component;
   a first detector for outputting a voltage signal proportional to the amplitude of the coherently shifted carrier frequency component;
   a second detector for outputting a voltage signal proportional to the amplitude of the sideband frequency component; and
   an amplitude comparator for determining the component with the larger detected relative amplitude.

10. The apparatus of claim 9 wherein said means for selecting comprises:
    a single-pole double-throw switch coupled to said amplitude comparator; and
    said amplitude comparator generating a signal which toggles said switch in order to output the component with the larger relative amplitude.

11. A method for processing an incident electromagnetic signal, comprising the steps of:
    measuring the orthogonal components of electromagnetic power in an incident electromagnetic signal;
    sampling the orthogonal electromagnetic power components to output on a single channel a sampled signal comprised of a carrier frequency component and two sideband frequency components in the frequency domain;
    separating the carrier frequency component from the sideband frequency components;
    comparing the relative amplitude of the carrier frequency component and one of the sideband frequency components; and
    outputting the component with the larger amplitude.

12. Apparatus for processing an incident electromagnetic signal, comprising:
    means for measuring the orthogonal components of electromagnetic power in an incident electromagnetic signal;
    means for sampling the orthogonal electromagnetic power components to output on a single channel a sampled signal comprised of a carrier frequency component and two sideband frequency components in the frequency domain;

means for separating the carrier frequency component from the sideband frequency components;

means for comparing the relative phase of the carrier frequency component and a sideband frequency component;

means for shifting one component to be in-phase with the other component; and means for summing the two components.

13. The apparatus of claim 12 wherein said means for measuring comprises a dual orthogonally polarized electromagnetic sensor.

14. The apparatus of claim 12 wherein said means for sampling comprises:

a single-pole, double-throw switch coupled to receive the measured orthogonal electromagnetic power components and output the sampled signal; and a switching oscillator connected to said switch to cause the switch to sample between the measured orthogonal power components.

15. The apparatus of claim 12 wherein said means for separating comprises:

a first filter for receiving the sampled signal, bandpass tuned to separate out the carrier frequency component; and a second filter for receiving the sampled signal, bandpass tuned to separate out one sideband frequency component.

16. The apparatus of claim 12 wherein said means for comparing comprises a phase detector for determining the phase difference between the carrier frequency component and a sideband frequency component.

17. The apparatus of claim 16 wherein said means for shifting comprises a phase shifter for shifting one component an amount substantially equal to the detected phase difference to be in-phase with the other component.

18. Apparatus for processing an incident electromagnetic signal, comprising:

means responsive to the incident electromagnetic signal for outputting on a single channel a sampled signal comprised of a carrier frequency component and two sideband frequency components in the frequency domain;

means for receiving the sampled signal on the single channel and for comparing the relative phase of the carrier frequency component and a sideband frequency component;

means for shifting one component to be in-phase with the other component; and means for summing the two components.

19. A method for processing an incident electromagnetic signal, comprising the steps of:

measuring the orthogonal components of electromagnetic power in an incident electromagnetic signal;

sampling the orthogonal electromagnetic power components to output on a single channel a sampled signal comprised of a carrier frequency component and two sideband frequency components in the frequency domain;

separating the carrier frequency component from the sideband frequency component;

comparing the relative phase of the carrier frequency component and a sideband frequency component;

shifting one component to be in-phase with the other component; and summing the two components.

20. Apparatus for processing an incident electromagnetic signal, comprising:

means responsive to the incident electromagnetic signal for outputting on a single channel a sampled signal comprised of a carrier frequency component and two sideband frequency components in the frequency domain; and means for separating the carrier frequency component from the sideband frequency components to output the carrier frequency component and one of the sideband frequency components.

21. The apparatus as in claim 20 wherein said means for outputting comprises:

means for measuring orthogonal components of electromagnetic power of the incident electromagnetic signal in a single plane perpendicular to the axis of propagation of the incident electromagnetic signal;

means for sampling the orthogonal electromagnetic power components to output the sampled signal.

22. The apparatus as in claim 21 wherein said means for measuring comprises a dual orthogonally polarized electromagnetic sensor.

23. The apparatus as in claim 20 further including means for comparing the relative amplitude and phase of the carrier and sideband frequency components of the sampled signal to identify the polarization characteristics of the incident electromagnetic signal.

24. The apparatus as in claim 23 wherein said means for comparing comprises::

amplitude measuring means for receiving and comparing the relative amplitude of the carrier and sideband frequency components of the sampled signal to determine wave type and orientation characteristics; and phase measuring means for receiving and comparing the relative phase difference between the carrier and sideband frequency components to determine wave rotation characteristic.

25. The apparatus as in claim 20 wherein said means for separating comprises:

a first filter for receiving the sampled signal, bandpass tuned to separate out the carrier frequency component; and a second filter for receiving the sampled signal, bandpass tuned to separate out one sideband frequency component.

26. The apparatus as in claim 20 further including:

means for comparing the relative amplitude of the carrier and sideband frequency components; and means responsive to the comparison for outputting the component with the larger amplitude.

27. The apparatus as in claim 26 wherein the means for outputting comprises a switch responsive to the means for comparing for selecting for output the component with the larger amplitude.

28. The apparatus as in claim 20 further including:

means for shifting the carrier and sideband frequency components in phase; and means for summing the in-phase carrier and sideband frequency components.

29. A method processing an incident electromagnetic signal, comprising the steps of:

measuring the orthogonally polarized components of the incident electromagnetic signal;

switching between the measured orthogonal components to output on a single channel a sampled signal comprised of a carrier frequency component and two sideband frequency components in the frequency domain; and separating the sampled signal to output the carrier frequency component and one of the sideband frequency components.

30. The method as in claim 29 including the steps of:

measuring and comparing the relative amplitude between the separated carrier component and the one sideband frequency component to determine the wave type and orientation of the polarized electromagnetic signal; and measuring and comparing the relative phase difference between the separated carrier component and the one sideband frequency component to determine the rotation of the polarized electromagnetic signal.

31. The method as in claim 29 further including the steps of:

comparing the relative amplitude of the output carrier and sideband frequency components; and responsive to the comparison, selecting for output the component with the larger amplitude.

32. The method as in claim 29 further including the steps of:

shifting the carrier and sideband frequency components in phase; and summing for output the in-phase carrier and sideband frequency components.

33. The apparatus as in claim 20 further including means for comparing the relative amplitude of the carrier and one of the sideband frequency components of the sampled signal to identify wave type of the incident electromagnetic signal.

34. The apparatus as in claim 20 further including means for comparing the relative amplitude of the carrier and one of the sideband frequency components of the sampled signal to identify orientation polarization characteristics of the incident electromagnetic signal.

35. The apparatus as in claim 20, further including means for comparing the relative phase between the carrier and one of the sideband frequency components to identify rotational polarization characteristics of the incident electromagnetic signal.

* * * * *